United States Patent [19]

Iseler et al.

[11] Patent Number: 4,662,860
[45] Date of Patent: May 5, 1987

[54] TELESCOPING LOW VIBRATION PULLING MECHANISM FOR CZOCHRALSKI CRYSTAL GROWTH

[75] Inventors: Gerald W. Iseler, Chelmsford; Brian S. Ahern, Acton, both of Mass.

[73] Assignee: The United States of America as represented by the Secretary of the Air Force, Washington, D.C.

[21] Appl. No.: 705,816

[22] Filed: Feb. 26, 1985

[51] Int. Cl.⁴ ............................ F16D 3/06; B01D 9/00
[52] U.S. Cl. .................................. 464/162; 74/22 R; 422/249
[58] Field of Search ............. 74/22 R, 22 A; 464/158, 464/162; 422/247, 249

[56] References Cited

U.S. PATENT DOCUMENTS

| 1,636,262 | 7/1927 | Troendly ......................... 464/162 X |
| 1,779,805 | 10/1930 | Dunwoodie . |
| 2,796,767 | 6/1957 | Carpenter .......................... 74/22 R |
| 3,552,931 | 1/1971 | Doherty et al. ................ 74/22 R X |
| 3,574,374 | 4/1971 | Keller et al. . |
| 3,802,278 | 4/1974 | Loomans ........................ 464/162 X |
| 3,805,552 | 4/1974 | Heald ................................ 464/162 |
| 4,131,420 | 12/1978 | Miller .................................. 432/246 |
| 4,397,055 | 8/1983 | Cuchiara ....................... 74/22 R X |

Primary Examiner—Stuart S. Levy
Assistant Examiner—Daniel P. Stodola
Attorney, Agent, or Firm—Jacob N. Erlich; James E. Maslow; Donald J. Singer

[57] ABSTRACT

A telescoping low vibration pulling mechanism for use in Czochralski crystal growth apparatus, comprising a broached bushing which defines an internal circumference of teeth therein, which teeth cooperate with complimentary teeth defined on the circumference of a splined shaft. The bushing is coupled to a motor drive via a hollow tube and the splined shaft, couplable to a seed shaft and an elevation assembly, telescopes through said bushing within said hollow tube.

1 Claim, 5 Drawing Figures

TELESCOPING LOW VIBRATION PULLING MECHANISM FOR CZOCHRALSKI CRYSTAL GROWTH

STATEMENT OF GOVERNMENT INTEREST

The invention described herein may be manufactured and used by or for the Government for governmental purposes without the payment of any royalty thereon.

BACKGROUND OF THE INVENTION

The present invention relates to Czochralski crystal growth devices, and more particularly, to an apparatus for reduction of vibration adverse to using such devices.

Metal single crystals can be prepared through controlled solidification. Although many single crystals grown without constraint tend to exhibit regular external faces, metal single crystals grown in a container conform to the shape of the container, if it is simple. Single crystals can be grown in several ways. In one method, a crucible containing the liquid is withdrawn at a fixed, slow rate from a furnace. Of the several grains formed at the pointed end of the crucible, only the most favorably oriented one survives to produce the single crystal. In a variation of this method, only a fraction of the material is molten at any one time, and this molten zone is moved slowly from one end of the material to the other, with a single crystal resulting as above. Such a molten zone can be achieved by a concentrated heat source in the form of an external electrical induction coil or an electrical resistance heating coil. In either of the above techniques, a small single crystal seed, which is kept solid at one end of the crucible, may be utilized to achieve a specific crystallographic orientation of the single crystal prepared.

Another widely used technique is that of crystal pulling. The material is melted in a crucible and held at a controlled temperature, and a small single crystal seed is brought into contact with the melt. As the seed is slowly withdrawn and rotated simultaneously, a single crystal grows. The diameter of the resulting single crystal is controlled by varying the melt temperature and/or the pulling rate. Although a holder is used for the seed, the crystal-liquid interface is unconstrained.

One problem with the above crystal pulling technique, particularly in Czochralski crystal pulling devices, is that rotation of the crystal requires mechanical linkage between a motor and the shaft to which the seed is attached. This linkage typically includes gear-type coupling, wherein gear teeth chatter and random vibration are experienced. This impacts upon the quality of the grown crystal.

Hence, it is the object of this invention to reduce the teeth chatter and vibration experienced in Czochralski crystal pulling devices.

SUMMARY OF THE INVENTION

The present invention comprises a telescoping low vibration pulling mechanism for use in Czochralski crystal growth apparatus, comprising a broached bushing which defines an internal circumference of teeth therein, which teeth cooperate with ccmplimentary teeth defined on the circumference of a splined shaft. The bushing is coupled to the means for rotation via a hollow tube and the splined shaft, couplable to a seed shaft and an elevation means, telescopes through said bushing within said hollow tube.

BRIEF DESCRIPTION OF THE DRAWINGS

The invention will be more clearly understood by reference to the following detailed description of a preferred embodiment thereof in conjunction with the accompanying drawings, in which.

DETAILED DESCRIPTION OF THE DRAWINGS

Figure 1:
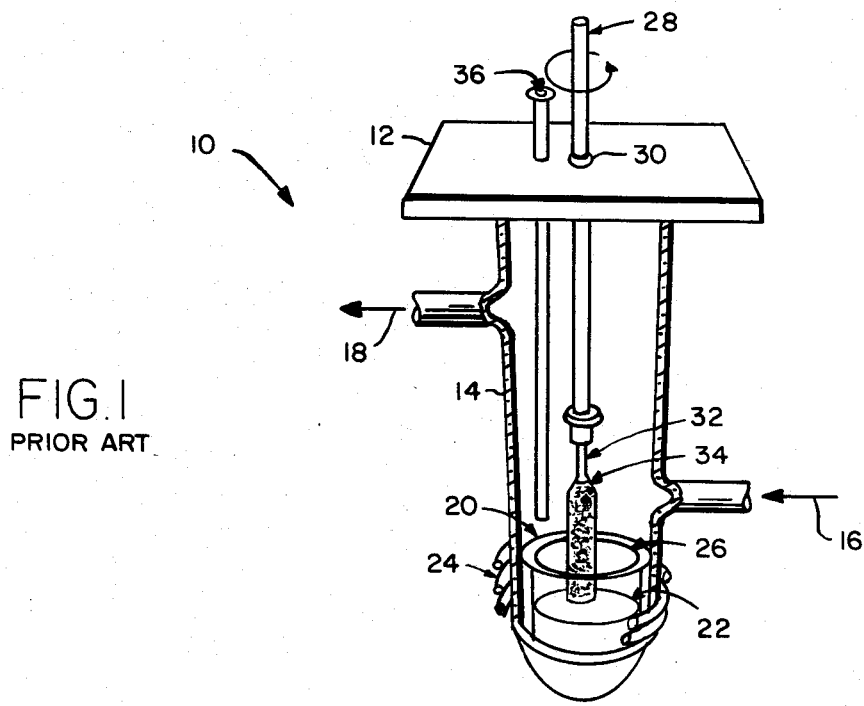
FIG. 1 is a cutaway perspective view of a known Czochralski crystal pulling device.

A prior art Czochralski crystal pulling device 10 is illustrated in part in the perspective view of FIG. 1, including a plate 12 to which a closed furnace chamber 14 is affixed. The chamber is vented at a gas inlet tube 16 for introduction of a working atmosphere and at an outlet tube 18 coupled to a pumping source. Inside the furnace chamber 14 is a graphite cup 20 for receipt of the crystal source compound (melt) 22. The chamber 14 is heated at least at the area of the cup 20 by means of heating element 24. The graphite cup is internally lined with a quartz liner 26. A seed shaft 28 is introduced into the chamber working area through a controlled opening 30 in plate 12. A seed crystal 32 is affixed to the working end of shaft 28. A tube 36 is also introduced through plate 12 into chamber 14 to facilitate doping, as desired.

In operation of the device 10, shaft 28 is initially displaced such that seed crystal 32 is in contact with melt 22. The shaft is then slowly rotated and drawn out of the chamber. Hence, crystal 34 is grown. This technique is widely utilized for the preparation of semiconductor single crystals for electronics industry applications. (For further background, see The Structure and Properties of Material, Vol. IV, by R. M. Rose, L. A. Shepard and J. Wulff, Wiley, New York, 1966.)

Figure 2:
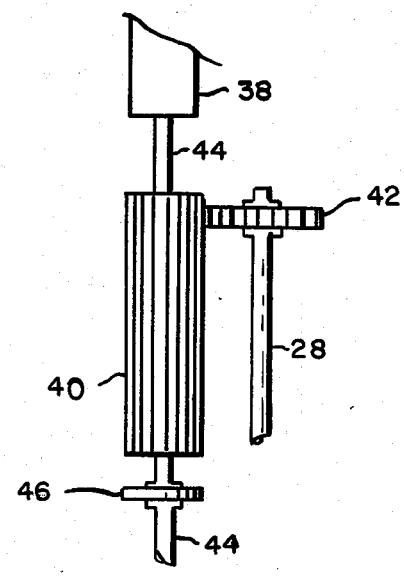
FIG. 2 is a side view of an illustrative drive arrangement for use with the device of FIG. 1.

FIG. 2 is a side view of an exemplary mechanical rotating and pulling means for use in the device of FIG. 1, including a rotating and elevating drive apparatus 38 coupled to shaft 28 via pinion gear 40 and spur gear 42, the latter affixed to the end of shaft 28. Pinion gear 40 is supported by means of a shaft 44 between apparatus 38 and journal 46. In this arrangement only one tooth is engaged at a time between spur gear 42 and pinion gear 40. Hence, unwanted chatter and random vibration can be transmitted therefrom to the crystal-in-growth. Undesireable irregularities and imperfections can result from these unwanted disturbances.

Figure 3:
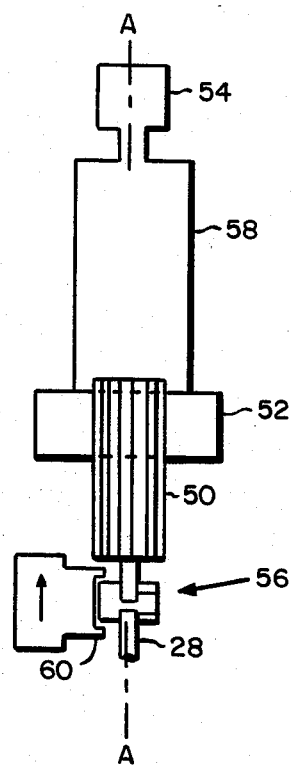
FIG. 3 is a side view of the inventive telescoping drive mechanism of the present invention.

The present invention is illustrated in the side view of FIG. 3 and comprises an externally splined shaft 50 cooperative with an internally splined broached bushing 52. More particularly, seed shaft 28 is coupled to one end of the splined shaft 50 at coupling 56. Motor 54 is coupled by means of hollow tube 58 to the broached bushing 52. The splined shaft 50 mates with and rides within the splined broached bushing 52. Coupling 56 cooperates with an elevation assembly 60 to achieve horizontal displacement of the rotating seed shaft within the furnace, as further discussed below.

Figure 4:
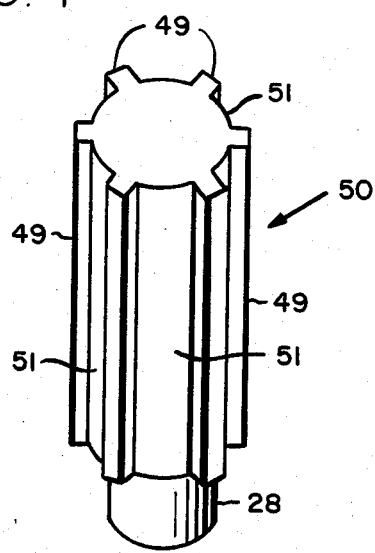
FIG. 4 is a perspective view of the splined shaft of the embodiment of FIG. 3.

Referring to FIG. 4, a perspective view of splined shaft 50 is illustrated. Shaft 50 comprises an elongated shaft having alternating troughs 51 and peaks 49 defining a multiplicity of splines around its periphery.

Figure 5:
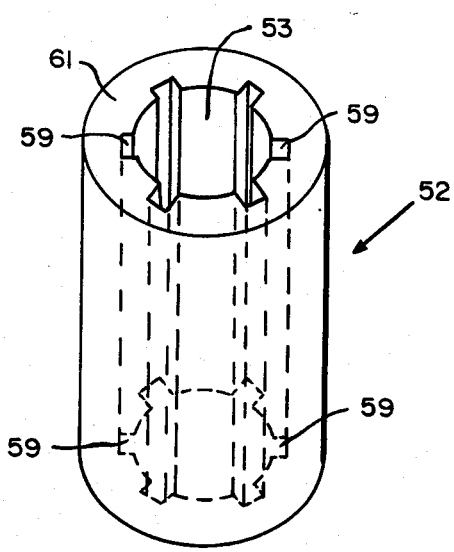
FIG. 5 is a perspective view of the broached bushing of the embodiment of FIG. 3.

FIG. 5 is a perspective view of broached bushing 52 having internally defined therein an orifice 53. More particularly, orifice 53 is defined by an inner wall of bushing 52 having alternating troughs 59 and peaks 61. Hence, shaft 50 and bushing 52 are complimentary in nature and matingly engage wherein the troughs 51 and peaks 49 of shaft 50 at all times respectively cooperate with the peaks 61 and troughs 59 of bushing 52 in a precise manner. Thus, unwanted chatter and vibration can be negated by means of all respective teeth and troughs of the shaft and bushing being in contact at all times during operation thereof.

During the process of crystal growth, the seed shaft must be lowered to bring the seed crystal into contact with the melt 22 in cup 20 at the base of the chamber. Thence, the shaft is simultaneously rotated and elevated out of the chamber. This rotation is achieved by means of fixed motor 54, which is coupled to bushing 52. This coupling is by means of a hollow tube 58 which at one thereof is fixedly mounted to the motor shaft and at the other end thereof is fixedly coupled to bushing 52. Hence, tube 58 and bushing 52 are concentrically mounted on the motor shaft axis A.

When the seed shaft is in the initial or starting position with the seed crystal 32 in contact with the melt 22, then the splined shaft 50 cooperates with bushing 52 as seen in FIG. 3. This represents the fully extended position of seed shaft 28. Retraction of shaft 28 out of the chamber is achieved by action of elevating assembly 60, coupled to shafts 28 and 50 at coupling 56, whereby the shaft is gently elevated out of the chamber as it is rotated. Assembly 60 may comprise a motor-driven micrometer type device, or other precision means having fine graduations. Hence, by means of assembly 60 cooperating with coupling 56, the seed shaft may be gradually elevated out of the chamber so as to achieve desired crystal growth.

In operation, melt 22 is loaded into cup 20, a seed crystal is affixed to the end of shaft 28, and the crystal is brought in contact with the melt. Thereafter, shaft 28 is rotated by means of motor 38. Simultaneously, the shaft is retracted by means of elevator assembly 60. During this rotating retraction the splined shaft 50 is displaced gradually into the hollow tube 58, via bushing 52, while shaft 50 continues to be driven by motor 54 via the coupled tube 58 and bushing 52. Hence, direct rotating drive is achieved by means of the telescoping shaft 50, bushing 52 and tube 58 in a manner which diminishes counterproductive teeth chatter and other production vibrations which can diminish the quality of crystal growth.

While the present invention has been described in connection with rather specific embodiments thereof, it will be understood that many modifications and variations will be readily apparent to those of ordinary skill in the art and that this application is intended to cover any adaptation or variation thereof. Therefore, it is manifestly intended that this invention be only limited by the claims and the equivalents thereof.

What is claimed is:

1. In a crystal growing furnace chamber having a cup for receipt of a crystal source compound, the improvement being in the form of a telescoping low vibration pulling mechanism for use in conjunction with said crystal source compound, said telescoping low vibration pulling mechanism comprising:

a broached bushing, said broached bushing having an internal longitudinal extending opening coincidential and coaxially aligned with a preselected longitudinal axis and defining a plurality of parallel peaks and troughs running longitudinally within said opening;

a splined shaft, said splined shaft having a longitudinal axis coaxially aligned with said preselected longitudinal axis and having longitudinally extending complimentary peaks and troughs such that such broached bushing and said splined shaft matingly engage;

a hollow tube, said hollow tube having an internal cylindrical configuration and being fixedly secured at one end thereof to said broached bushing and having a longitudinal axis coaxially aligned with said preselected longitudinal axis, said hollow tube having said internal cylindrical configuration dimensioned to accept said splined shaft therein;

a motor, said motor having a drive shaft positioned along and coaxially aligned with said preselected longitudinal axis, said drive shaft being fixedly coupled to the other end of said hollow tube, said hollow tube and said broached bushing being concentrically mounted with respect to said drive shaft;

a seed shaft, said seed shaft having a longitudinal axis coaxially aligned with said preselected longitudinal axis and having one end thereof immersible within said crystal source compound located within said cup of said furnace chamber;

a coupling, said coupling interconnecting the other end of said seed shaft to said splined shaft; and an elevating assembly, said elevating assembly being interconnected to said coupling for gently raising said splined shaft in a longitudinal direction into said hollow tube and thereby raising said seed shaft from said cup while said motor rotates said seed shaft.

* * * * *